(12) United States Patent
Henson et al.

(10) Patent No.: US 7,709,910 B2
(45) Date of Patent: May 4, 2010

(54) SEMICONDUCTOR STRUCTURE FOR LOW PARASITIC GATE CAPACITANCE

(75) Inventors: William K. Henson, Beacon, NY (US); Paul Chung-Muh Chang, Mahopac, NY (US); Dureseti Chidambarrao, Weston, CT (US); Ricardo A. Donaton, Cortlandt Manor, NY (US); Yaocheng Liu, Elmsford, NY (US); Shreesh Narasimha, Beacon, NY (US); Amanda L. Tessier, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 11/738,666

(22) Filed: Apr. 23, 2007

(65) Prior Publication Data

US 2008/0258234 A1    Oct. 23, 2008

(51) Int. Cl.
*H01L 29/78* (2006.01)
(52) U.S. Cl. ............... 257/412; 257/413; 257/E21.165
(58) Field of Classification Search ............... 257/522, 257/288, 384, 412, 413, 388; 438/619, 421, 438/422, 585, 592
See application file for complete search history.

(56) References Cited

U.S. PATENT DOCUMENTS

| | | | | |
|---|---|---|---|---|
| 5,914,519 A | * | 6/1999 | Chou et al. ............... | 257/410 |
| 6,064,107 A | * | 5/2000 | Yeh et al. ............... | 257/522 |
| 6,190,996 B1 | * | 2/2001 | Mouli et al. ............... | 438/400 |
| 6,693,335 B2 | * | 2/2004 | Gonzalez et al. ............ | 257/410 |
| 2002/0060346 A1 | * | 5/2002 | Cheng et al. ............... | 257/382 |
| 2006/0189056 A1 | * | 8/2006 | Ko et al. ............... | 438/197 |
| 2008/0102612 A1 | * | 5/2008 | Dyer et al. ............... | 438/533 |

* cited by examiner

*Primary Examiner*—Phat X Cao
*Assistant Examiner*—Nga Doan
(74) *Attorney, Agent, or Firm*—Scully, Scott, Murphy & Presser, P.C.; H. Daniel Schnurmann

(57) ABSTRACT

A semiconductor structure provides lower parasitic capacitance between the gate electrode and contact vias while providing substantially the same level of stress applied by a nitride liner as conventional MOSFETs by reducing the height of the gate electrode and maintaining substantially the same height for the gate spacer. The nitride liner contacts only the outer sidewalls of the gate spacer, while not contacting inner sidewalls, or only a small area of the inner sidewalls of the gate spacer, therefore applying substantially the same level of stress to the channel of the MOSFET as conventional MOSFETs. The volume surrounded by the gate spacer and located above the gate electrode is either filled with a low-k dielectric material or occupied by a cavity having a dielectric constant of substantially 1.0. The reduced height of the gate electrode and the low-k dielectric gate filler or the cavity reduces the parasitic capacitance.

4 Claims, 12 Drawing Sheets

US 7,709,910 B2

SEMICONDUCTOR STRUCTURE FOR LOW PARASITIC GATE CAPACITANCE

FIELD OF THE INVENTION

The present invention relates to semiconductor structures, and particularly to semiconductor structures with low parasitic gate capacitance and methods of manufacturing the same.

BACKGROUND OF THE INVENTION

Parasitic gate capacitance of a field effect transistor (FET) reduces the performance of the transistor by reducing the switching speed. Specifically, the capacitive coupling of a gate electrode to adjacent circuit components limits the rate at which the voltage of the gate electrode may be changed. The delay in the changes in the gate voltage due to the capacitive coupling with adjacent circuit components is then reflected in an increase in a turn-on time and a turn-off time of the field effect transistor.

All transistors with a gate electrode, including junction field effect transistors (JFETs) and metal-oxide-semiconductor field effect transistors (MOSFETs), are prone to this type of parasitic capacitive coupling to adjacent circuit components by design. Particularly, high performance MOSFETs, in which contact vias to the source and drain regions are located close to the gate electrode to minimize the parasitic resistance of the source and drain region, suffer from high parasitic capacitance between the gate electrode and the contact vias due to their physical proximity.

Since both the gate electrode and the contact vias are physical structures, the parasitic capacitance may be reduced by scaling the dimensions of the gate electrode, the contact vias, or both. In one approach, the parasitic capacitance between the gate dielectric and a contact via may be reduced by reducing the height of the contact via. The reduction in the parasitic capacitance in this case is less than linear to the decrease in the height of the contact via since an M1 level (first level) metal wire moves close to the gate conductor correspondingly as the height of the contact via decreases, thereby increasing the parasitic capacitance between the gate conductor and the M1 line.

In another approach, the height of the gate conductor may be decreased to reduce the parasitic capacitance. In this case, the parasitic capacitance between the gate dielectric and the contact via is substantially linearly proportional to the height of the gate electrode. For example, the parasitic capacitance between a gate conductor line having a height of about 150 nm and a contact via located about 70 nm away from the gate conductor line, and having a silicon nitride gate spacer in between, is approximately 12 aF ($1.2 \times 10^{-17}$ F). By reducing the height of the gate conductor to 75 nm, the parasitic capacitance may be reduced to approximately 6 aF ($6.0 \times 10^{-18}$ F). Therefore, decreasing the height of the gate conductor is a more effective method of reducing the parasitic resistance than decreasing the height of contact vias.

In general, such reduction in the parasitic capacitance reduces the signal delay between two consecutive stages of a MOSFET circuit in which an output signal from a source or drain of the first stage MOSFET is fed into the gate electrodes of the second stage MOSFETs. While the degree of the reduction of the signal delay depends on the specifics of a circuit layout, it is estimated that the reduction of the parasitic capacitance from about 12 aF to 6 aF per pair of a gate electrode and a contact via, as described in the example above, leads to about a 3% reduction in the signal delay time for a two stage MOSFET circuit with a fanout of three, i.e., the first stage MOSFET drives three second stage MOSFETs, when the first MOSFET and each of the three second stage MOSFET are substantially of the same size.

Some structures for reducing the parasitic capacitance between the gate electrode and contact vias to achieve such improvements in circuit performance are known in the art. FIGS. 1-4 show an exemplary prior art structure intended to reduce parasitic capacitance between a gate electrode and contact vias at various stages of a manufacturing sequence.

Referring to FIG. 1, the exemplary prior art structure comprises a p-type MOSFET 99 and an n-type MOSFET 199, formed on a semiconductor substrate 10 and separated by shallow trench isolation 20. Each of the two MOSFETs (99, 199) at this stage comprises a gate dielectric 30 located directly on the semiconductor substrate 10, a silicon containing gate conductor 32, a disposable gate filler 34, and a gate spacer 40. The gate dielectric 30 may comprise silicon oxide, silicon oxynitride, high-K dielectric material, or a stack thereof. The silicon containing gate conductor 32 comprises polysilicon, or preferably, amorphous silicon and has a thickness of about 20 nm. The disposable gate filler 34 comprises silicon germanium alloy and has a thickness of about 80 nm. The gate spacer 40 typically comprises silicon nitride, which has a dielectric constant of about 7.5.

Referring to FIG. 2, source and drain regions 12 are formed by ion implantation into the semiconductor substrate 10. The disposable gate filler 34 is thereafter etched, preferably by a wet etch, to expose a top surface of the silicon containing gate conductor 32 and portions of inner sidewalls of the gate spacer 40.

Referring to FIG. 3, gate silicides 42 and source and drain silicides 44 are formed during a silicidation process. A first nitride liner 60 and a second nitride liner 61 are deposited on the source and drain silicides 44, inner sidewalls and outer sidewalls of the gate spacers 40, and on the gate silicides 42. The first and second nitride liners (60, 61) serve as mobile ion diffusion barriers, which block diffusion of mobile ions, such as $Na^+$ and $K^+$, from a middle-of-line (MOL) dielectric 70 or other back-end-of-line (BEOL) dielectric layers (not shown) into the semiconductor substrate 10. Furthermore, the first and second nitride liners (60, 61) may apply stress to underlying structures, and specifically, to the channels of the p-type MOSFET 99 and the n-type MOSFET 199. Highly preferably, the first nitride liner 60, which is located above the p-type MOSFET 99, applies a compressive uniaxial stress along the direction of the channel of the p-type MOSFET 99. Similarly, the second nitride liner 61, which is located above the n-type MOSFET 199, applies a tensile uniaxial stress along the direction of the channel of the n-type MOSFET 199.

The height of the gate electrode 48 of the prior art, which comprises the silicon containing gate conductor 32 and the gate silicide 42, has a height lower than the height of conventional gate electrode, which is substantially the same as the height of the gate spacers 40. According to the prior art, the parasitic capacitance between the gate electrode 48 and the contact vias 88 is thus reduced substantially in proportion to the height of the gate electrode 48.

The prior art described herein, however, has a disadvantage of reducing the stress applied by the first or second nitride liner (60 or 61) on the channel of the underlying MOSFET (99 or 199). Referring to FIG. 4, a magnified view of the p-type MOSFET 99 shows the structural components that determine the stress on the underlying channel 14. The arrows refer to the direction of the stress applied by the first nitride liner 60 to the underlying surfaces. Since the first nitride liner 60 contacts both the outer sidewalls and portions of the inner sidewalls of the gate spacer 40, a substantial fraction of the stress applied by the first nitride liner 60 to the outer sidewalls of the gate spacer 40 is cancelled by the stress applied by the same first nitride liner 60 to the portion of the inner sidewalls of the gate spacer 40. The net stress applied to the channel according the prior art is substantially proportional to the height of the gate electrode 48. The same effect occurs on the n-type MOSFET 199 with the difference being the direction of the applied stress.

While providing an advantageous effect of reduced parasitic capacitance between the gate electrode 48 and the contact vias 88, the prior art structure described above also produces a deleterious effect of reducing the stress applied to the channel of the MOSFET. The reduction in the stress, and the resulting reduction in the mobility of the minority carriers in the channel of the MOSFETs (99, 199) are detrimental to the performance of the prior art MOSFETs (99, 199).

Also, the dielectric constant of the nitride liners (60, 61) is about 7.5, which is a relatively high dielectric constant among semiconductor dielectric materials. The relatively high value of the dielectric constant of the nitride liners above the gate electrode 48 affects the parasitic capacitance adversely since the parasitic capacitance is also proportional to the dielectric constant of the material between the gate electrode 48 and the contact vias 88.

Therefore, there exists a need for a semiconductor structure in which the parasitic capacitance between a gate electrode and contact vias of a FET structure is reduced while providing substantially the same level of stress to the channel of the FET as conventional FETs and methods of manufacturing the same.

Further, there exists a need to reduce the dielectric constant of the material above the gate electrode while minimizing the size of the gate electrode and providing substantially the same level of stress to the channel of the FET as conventional FETs and methods of manufacturing the same.

SUMMARY OF THE INVENTION

The present invention addresses the needs described above by providing a stack of a reduced height gate electrode and a low-k dielectric gate filler or a cavity surrounded by the inner sidewalls of a gate spacer in a MOSFET. The gate electrode has a reduced height compared with conventional gate electrodes, while the gate spacer has substantially the same height as conventional gate spacers. A nitride liner contacts only the outer sidewalls of the gate spacer, while not contacting the inner sidewalls, or only a small area of the inner sidewalls of the gate spacer. The volume surrounded by the gate spacer and located above the gate electrode is either filled with a low-k dielectric material or occupied by a cavity having a dielectric constant of substantially 1.0. The reduced height of the gate electrode and the lower dielectric constant of the volume above the gate electrode reduce the parasitic capacitance. Since the nitride liner contacts no portion or only a small area of the inner sidewalls of the gate spacer, substantially the same level of stress can be applied by the nitride liner to the channel of the transistor.

According to a first embodiment of the present invention, a metal-oxide-semiconductor field effect transistor (MOSFET) structure comprises:

a gate electrode contacting a gate dielectric;

a gate spacer having inner sidewalls contacting the gate electrode; and a low-k dielectric gate filler having a dielectric constant of about 3.0 or less and contacting the gate electrode and the inner sidewalls of the gate spacer.

The MOSFET structure may further comprise a low-k secondary gate spacer contacting the gate spacer and a source and drain silicide and disjoined from, i.e., not adjoined to, a source and drain region.

Preferably, the MOSFET structure may further comprise at least one contact via directly contacting the source and drain region. The MOSFET structure may comprise multiple contact vias contacting the source and drain region. The MOSFET structure may also further comprise at least one contact via directly contacting a gate silicide.

The gate dielectric may comprise silicon oxide, silicon nitride, silicon oxynitride, a high-k dielectric layer, or a stack thereof. The gate electrode may have a silicon containing gate conductor contacting the gate dielectric and a gate silicide contacting the silicon containing gate conductor. Alternatively, the gate dielectric may comprise a high-k dielectric material and the gate electrode is a fully silicided gate electrode comprising a metal silicide, wherein the metal silicide directly contacts the gate dielectric. The silicon containing gate conductor has a thickness in the range from about 10 nm to about 50 nm and the low-k dielectric gate filler has a thickness in the range from about 40 nm to about 150 nm.

The MOSFET structure preferably further comprises a nitride liner contacting the low-k dielectric gate filler and the gate spacer. The nitride liner may apply a stress preferably greater than about 0.2 GPa, and more preferably greater than about 0.5 GPa, to a channel located directly beneath the gate dielectric.

According to a second embodiment of the present invention, a metal-oxide-semiconductor field effect transistor (MOSFET) structure comprises:

a gate electrode contacting a gate dielectric;

a gate spacer having inner sidewalls contacting the gate electrode; and an enclosed cavity having a dielectric constant of about 1.0 and contacting the gate electrode and the inner sidewalls of the gate spacer.

The MOSFET structure may further comprise a low-k secondary gate spacer having a dielectric constant of about 3.0 or less and contacting the gate spacer and a source and drain silicide, and disjoined from, i.e., not adjoined to, a source and drain region.

The gate dielectric may comprise silicon oxide, silicon nitride, silicon oxynitride, a high-k dielectric layer, or a stack thereof. The gate electrode may have a silicon containing gate conductor contacting the gate dielectric and a gate silicide contacting the silicon containing gate conductor. Alternatively, the gate dielectric may comprise a high-k dielectric material and the gate electrode is a fully silicided gate electrode comprising a metal silicide, wherein the metal silicide directly contacts the gate dielectric. The silicon containing gate conductor has a thickness in the range from about 10 nm to about 50 nm and the low-k dielectric gate filler has a thickness in the range from about 40 nm to about 150 nm.

The MOSFET structure may further comprise at least one contact via directly contacting the enclosed cavity and the gate silicide.

The MOSFET structure may further comprise a nitride liner contacting the enclosed cavity and the gate spacer. The nitride liner may apply a stress preferably greater than about 0.2 GPa, and more preferably greater than about 0.5 GPa, to a channel located directly beneath the gate dielectric.

According to the present invention, a method of manufacturing a semiconductor structure comprises:

forming a stack of a gate electrode and a disposable gate filler on a semiconductor substrate;

forming a gate spacer around the stack;

removing the disposable gate filler; and filling at least of portion of the volume of the removed disposable filler with a low-k dielectric gate filler having a dielectric constant of about 3.0 or less.

The method may further comprise forming a low-k secondary gate spacer directly on the gate spacer and a source and drain silicide, wherein the low-k secondary gate spacer has a dielectric constant of about 3.0 or less.

The method may further comprise forming a nitride liner on the low-k dielectric gate filler and the gate spacer. The nitride liner may apply a stress preferably greater than about 0.2 GPa, and more preferably greater than about 0.5 GPa, to a channel located beneath the gate electrode.

The method may further comprise:

forming a gate dielectric on a semiconductor substrate;

forming a silicon containing gate conductor on the gate dielectric; and forming a gate silicide on the silicon containing gate conductor, wherein the gate electrode comprises the silicon containing gate conductor and the gate silicide.

The method may further comprise forming a cavity confined by the gate silicide, the gate spacer, and by the nitride liner. The cavity may be formed by etching at least one contact via hole through a middle-of-line dielectric and through the nitride liner over the gate silicide and laterally etching the low-k dielectric gate filler.

At least one gate contact via contacting the gate silicide may be formed in at least one gate contact via hole. The cavity is enclosed by the at least one gate contact via contacting the gate silicide.

BRIEF DESCRIPTION OF THE DRAWINGS

FIGS. 2-9, and 10A show sequential vertical cross-sectional views of an exemplary semiconductor structure according to the present invention in the direction perpendicular to two gate lines at various stages of a manufacturing sequence. The plane X-X' is the plane of the vertical cross-section for FIG. 10B.

DETAILED DESCRIPTION OF THE INVENTION

Figure 1:
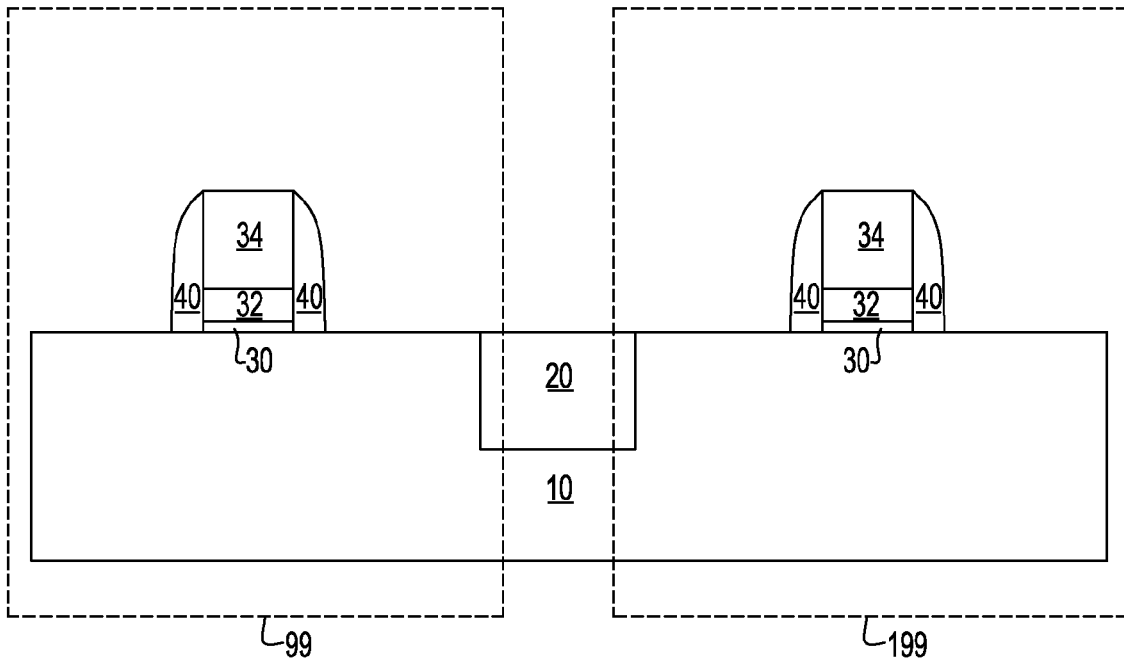
FIGS. 1-4 show vertical cross-sectional views of an exemplary prior art structure for reducing parasitic capacitance between a gate electrode and contact vias in the direction perpendicular to two gate lines at various stages of a manufacturing sequence.
Figure 2:
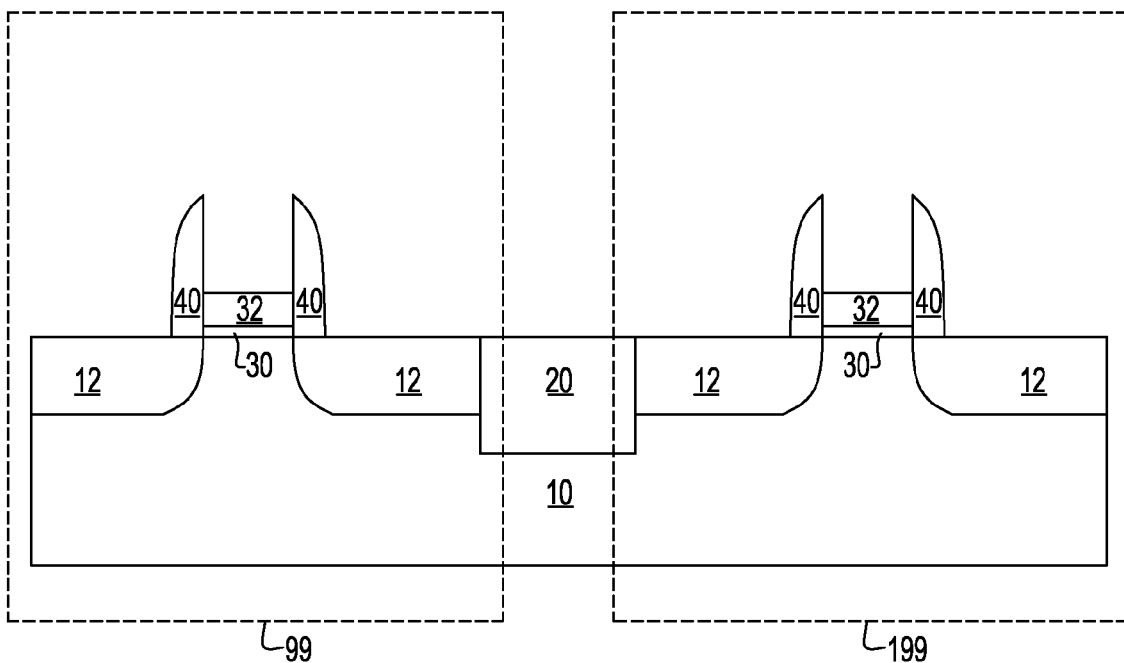
Figure 3:
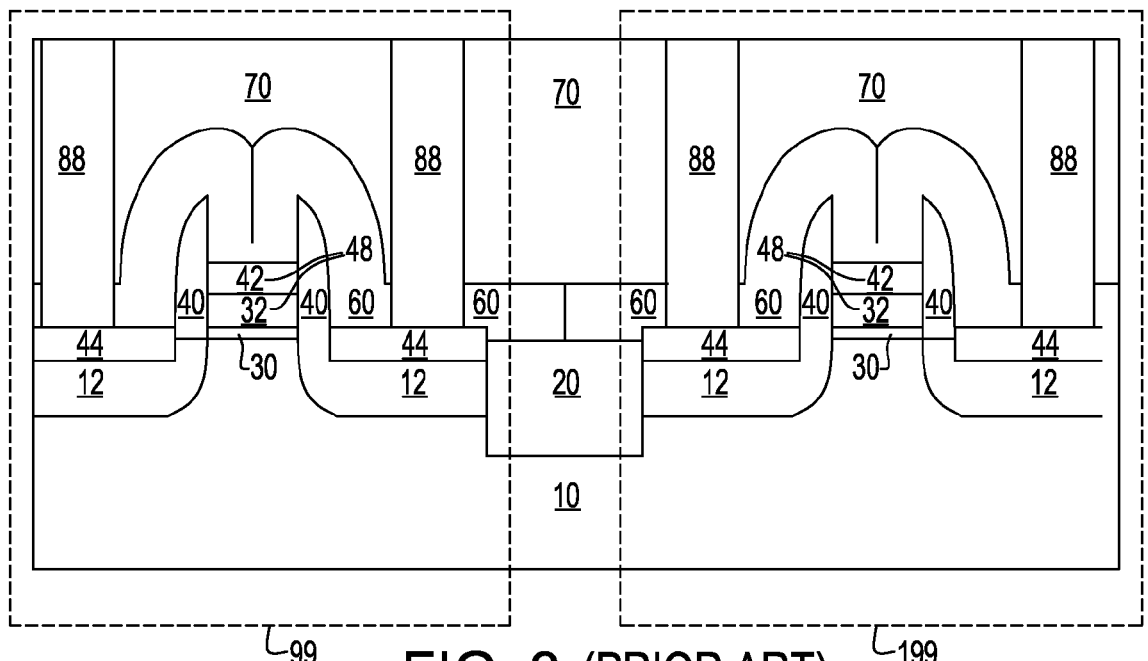
Figure 4:
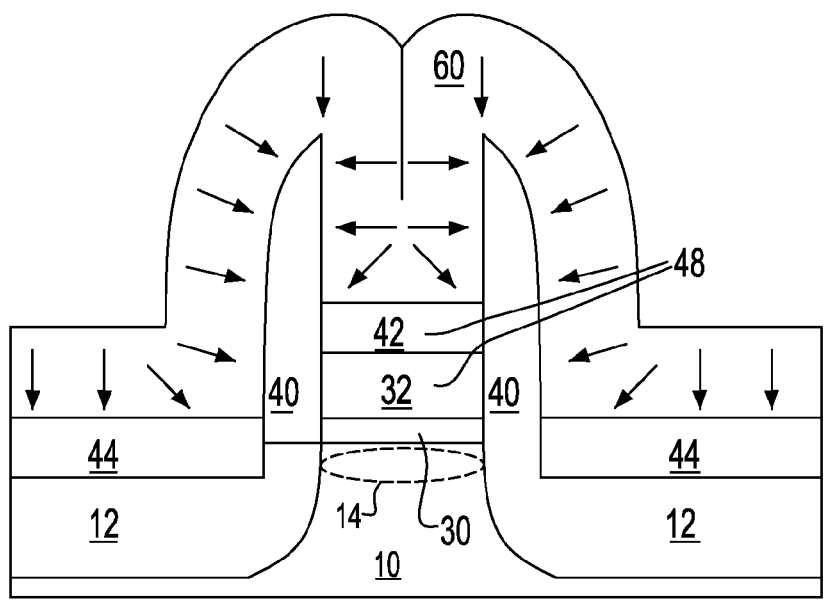

As stated above, the present invention relates to semiconductor structures with low parasitic gate capacitance and methods of manufacturing the same, which are now described in detail with accompanying figures. It is noted that like and corresponding elements are referred to by like reference numerals.

Figure 5:
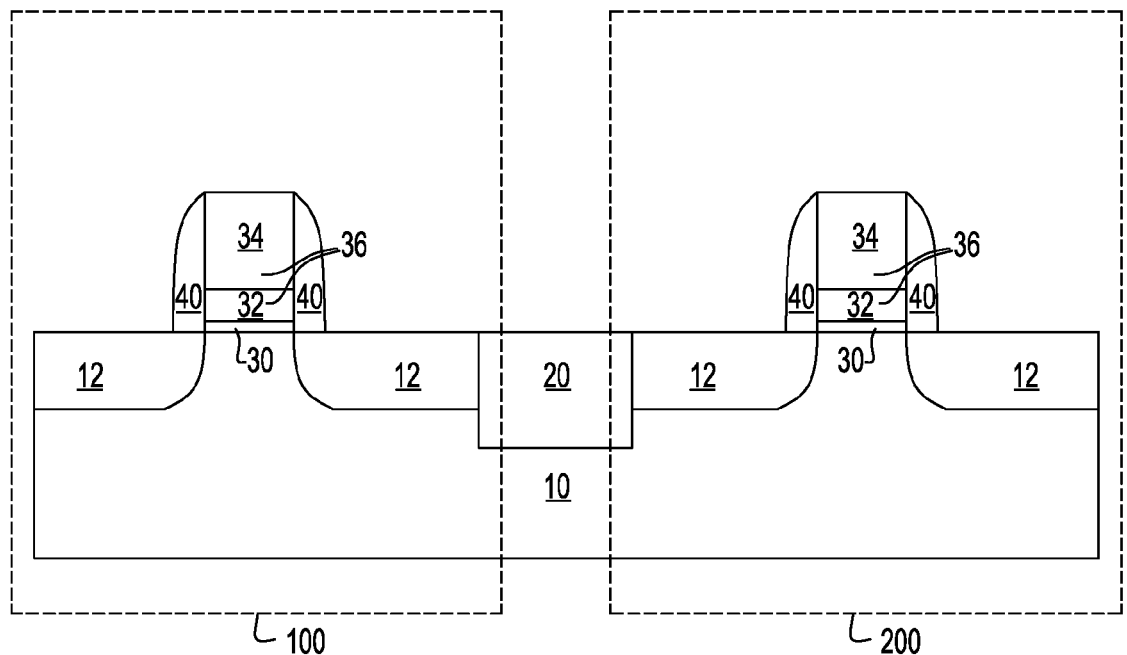

Referring to FIG. 5, an exemplary semiconductor structure according to the present invention comprises a p-type MOSFET 100 and an n-type MOSFET 200, formed on a semiconductor substrate 10 and separated by shallow trench isolation 20. Each of the two MOSFETs (100, 200) at this stage comprises a gate dielectric 30 located directly on the semiconductor substrate 10, a silicon containing gate conductor 32, a disposable gate filler 34, and a gate spacer 40. The gate dielectric 30 may comprise silicon oxide, silicon oxynitride, high-K dielectric material, or a stack thereof. The silicon containing gate conductor 32 comprises polysilicon, or preferably, amorphous silicon. Preferably, the silicon containing gate conductor 32 has a thickness in the range from about 15 nm to about 60 nm at this point.

The disposable gate filler 34 may comprise a silicon germanium alloy with a germanium concentration of at least 1%, and preferably about 35% or higher, in atomic concentration. Alternatively, the disposable filler 34 may comprise other semiconductor material that may be etched selective to silicon, metal silicide, silicon oxide, and silicon nitride. Preferably, the disposable gate filler 34 has a thickness in the range from about 40 nm to about 150 nm. The gate spacers 40 typically comprise silicon nitride, which has a dielectric constant of about 7.5. The gate spacer 40 is of unitary construction and contacts the substantially vertical sidewalls of the stack 36 of the silicon containing gate conductor 32 and the disposable gate filler 34. Typically, the stack 36 is topologically homeomorphic to a sphere, i.e., may be transformed into a sphere by continuous stretching and bending, and the gate spacer 40 is topologically homeomorphic to a torus, i.e., may be transformed into a torus by continuous stretching and bending. Source and drain regions 12 are formed typically by multiple rounds of ion implantation steps with suitable block level masks in the semiconductor substrate 10. The silicon containing gate conductor 32 may be doped with dopants by ion implantation as well.

The disposable gate filler 34 is thereafter etched preferably by a wet etch, for example, by a solution containing ammonium hydroxide (NH$_4$OH) or hydrofluoric acid (HF). In general, the higher the germanium concentration in the disposable gate filler 34, the higher the etch rate of the disposable gate filler 34 since germanium is readily oxidized by a strong oxidizer. The top surface of the silicon containing gate conductor 32 and the portions of the substantially vertical inner sidewalls of the gate spacer 40 above the top surface of the silicon containing gate conductor 32 are exposed after the removal of the disposable gate filler 34.

Figure 6:
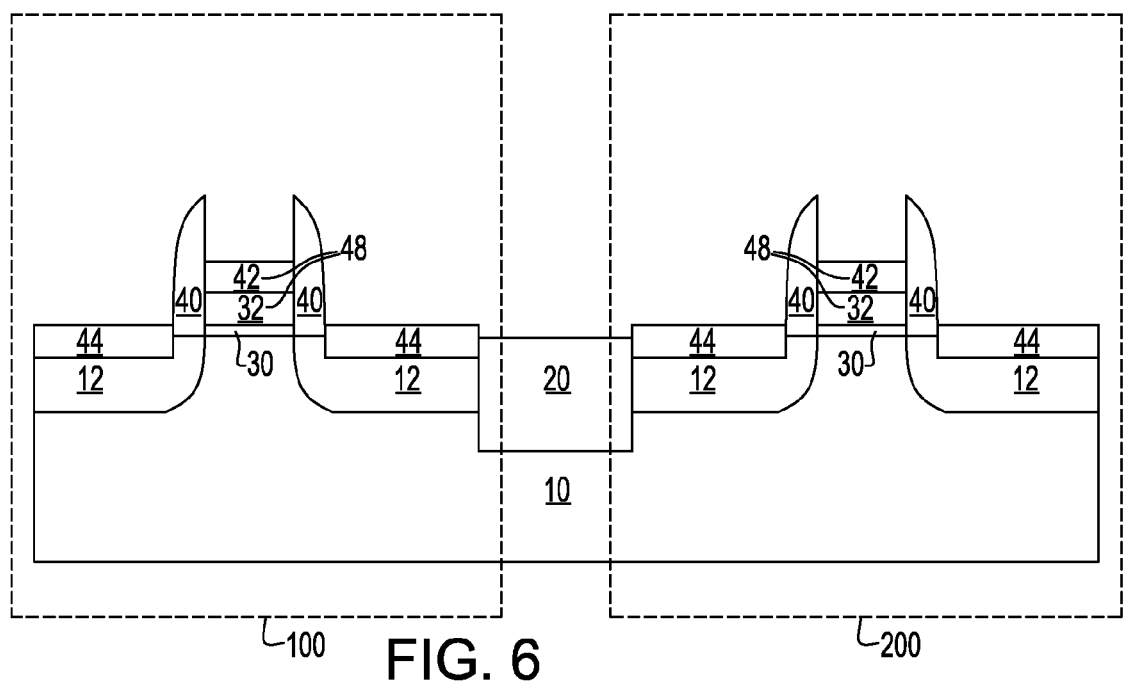

Referring to FIG. 6, a metal layer (not shown) is deposited on the MOSFETs (100, 200) typically by a blanket deposition and followed by at least one silicidation anneal to form a gate silicide 42 and a source and drain silicide 44 in each of the two MOSFETs (100, 200). Unreacted portions of the metal layer are removed, for example, by a wet etch. During the silicidation process, a portion of the silicon containing gate electrode 32 is consumed to form the gate silicide 42. Typically, the thickness of the consumed silicon containing gate electrode 32 is approximately ½ of the thickness of the gate silicide 42 formed therefrom. Preferably, the silicon containing gate conductor 32 has a thickness in the range from about 10 nm to about 50 nm after the consumption of the portion during the silicidation process.

Figure 7:
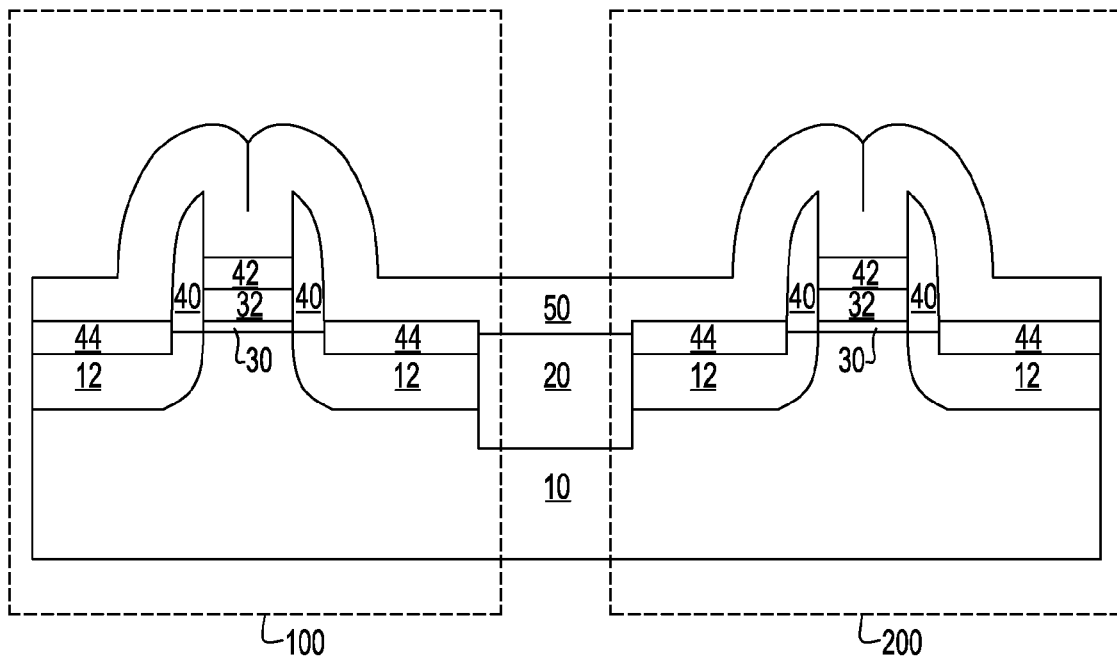

Referring to FIG. 7, a low-k dielectric filler layer 50 is deposited on the source and drain silicides 44, the outer sidewalls of the gate spacer 40, the portions of the inner sidewalls of the gate spacer 40 above the top surface of the gate silicide 42, and the top surface of the gate silicide 42. The low-k dielectric filler layer 50 comprises a dielectric material with a dielectric constant of about 3.0 or less, preferably less than about 2.8, and more preferably less than about 2.5. The low-k dielectric gate filler layer 50 may, for example, comprise a porous or nonporous CVD low-k dielectric material.

Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Such CVD low-k dielectric material has a dielectric constant of not more than about 2.8 and typically comprises between about 5 and about 40 atomic percent of Si; between about 5 and about 45 atomic percent of C; between 0 and about 50 atomic percent of O; and between about 10 and about 55 atomic percent of H. The tri-bonded network may include a covalently bonded tri-dimensional ring structure comprising Si—O, Si—C, Si—H, C—H and C—C bonds.

Further, the CVD low-k dielectric material may comprise F and N and may optionally have the Si atoms partially substituted by Ge atoms. The CVD low-k dielectric material may contain molecular scale voids (i.e., nanometer-sized pores) of between about 0.3 to about 50 nanometers in diameter, and most preferably between about 0.4 and about 10 nanometers in diameter, further reducing the dielectric constant of the low-k dielectric filler layer 50 to values below about 2.0. The nanometer-sized pores of the low-k dielectric filler layer 50 occupy a volume of between about 0.5% and about 50% of a volume of the material.

Figure 8:
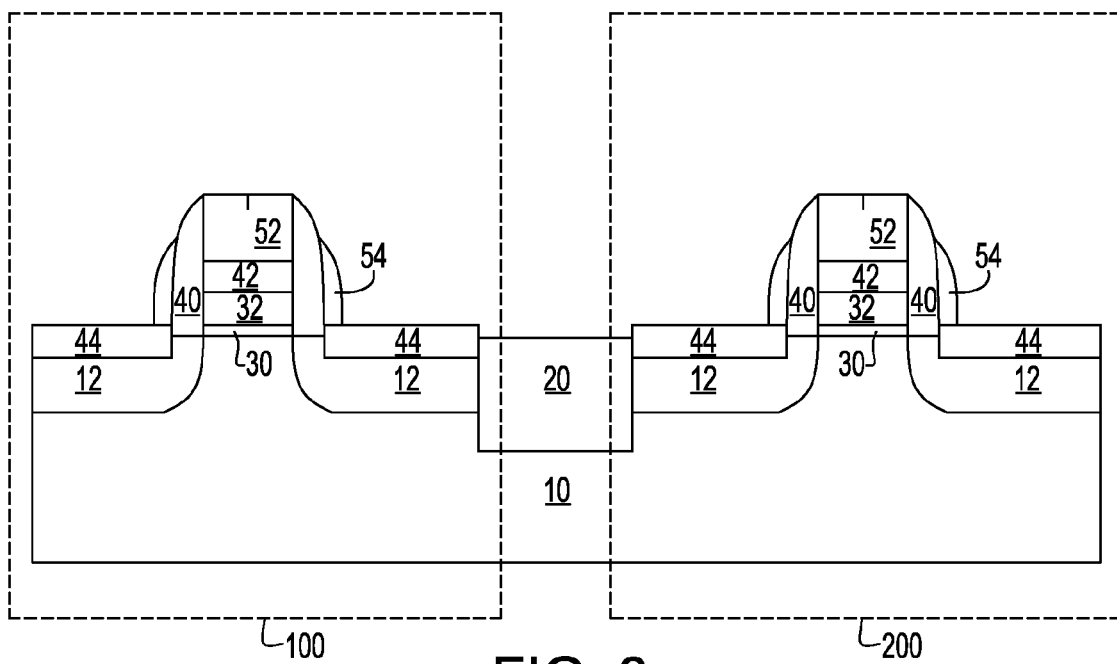

Referring to FIG. 8, the low-k dielectric filler layer 50 is etched by a reactive ion etch (RIE) to remove the portions over the source and drain silicides 44. Typically, at least a portion of the outer sidewalls of the gate spacer 40 is exposed after the RIE. Depending on the step coverage of the low-k dielectric filler layer 50 as deposited and the degree of the overetch after the source and drain silicides 44 are exposed, a low-k secondary gate spacer 54 may, or may not, be formed on the outer sidewalls of the gate spacer 54. FIG. 8 shows the exemplary semiconductor structure in which the low-k secondary gate spacers 54 are present.

A low-k dielectric gate filler 52 is formed within the inner sidewalls of the gate spacer 40 and above the gate silicide 42 in each of the two MOSFETs (100, 200) out of the remaining portions of the low-k dielectric filler layer 50 after the RIE. The low-k dielectric gate filler 52 directly contacts the gate silicide 42 and the inner sidewalls of the gate spacer 40. The top surface of the low-k dielectric gate filler 52 may be flush with the top of the gate spacer 40 as shown in FIG. 8, or alternatively, may be recessed relative to the top of the gate spacer 40. The thickness of the low-k dielectric gate filler 52 is typically in the range from about 40 nm to about 150 nm.

Figure 9:
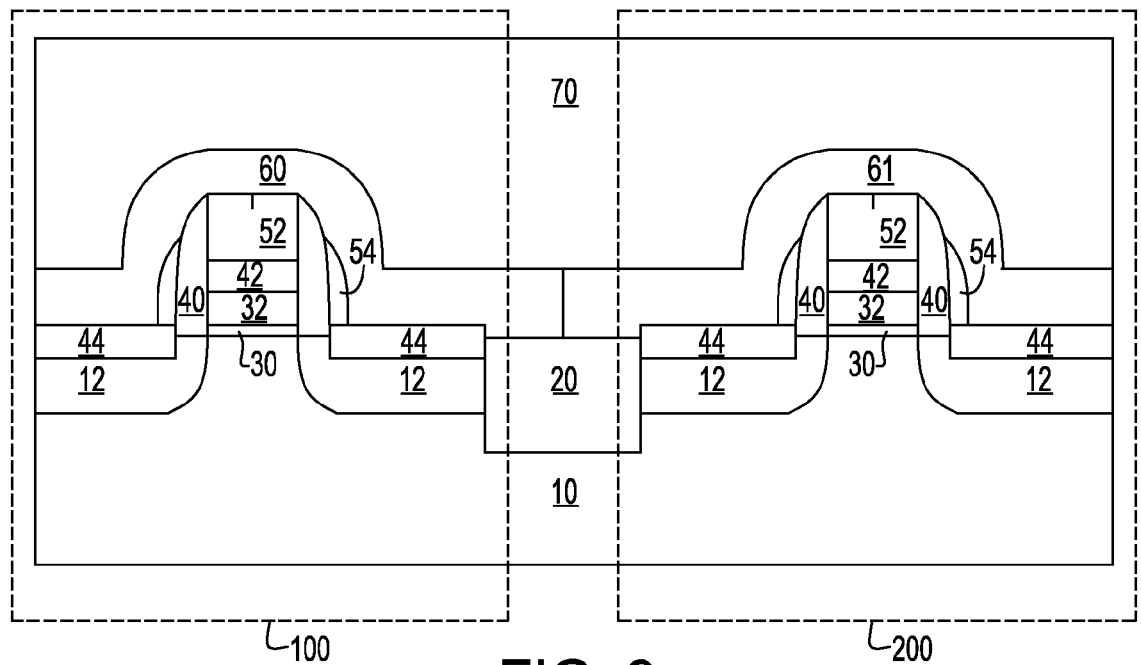

Referring to FIG. 9, a first nitride liner 60 and a second nitride liner 61 are formed on top of the source and drain silicides 44 and on the top surface of the low-k dielectric gate filler 52. The first nitride liner 60 and the second nitride liner 61 may be the same nitride liner having the same properties and formed during the same processing step. Alternatively and preferably, the first nitride liner 60 and the second nitride liner 61 may be different nitride liners having different properties and formed by different processing steps. For example, each of the first nitride liner 60 and the second nitride liner 61 may be a stress liner that applies stress to the underlying structures, and particularly to the channel of the p-type or n-type MOSFET (100 or 200).

Preferably, the first nitride liner 60 located above the p-type MOSFET 100 applies a uniaxial compressive stress to the channel located directly beneath the gate dielectric 30 of the p-type MOSFET 100 along the direction of the channel, i.e., along the direction connecting the source and the drain of the p-type MOSFET 100. The magnitude of the uniaxial compressive stress is typically about 0.2 GPa or greater, and preferably about 0.5 GPa or greater. Similarly, the second nitride liner 61 located above the n-type MOSFET 200 applies a uniaxial tensile stress to the channel located directly beneath the gate dielectric 30 of the n-type MOSFET 100 along the direction of the channel, i.e., along the direction connecting the source and the drain of the n-type MOSFET 200. The magnitude of the uniaxial tensile stress is typically about 0.2 GPa or greater, and preferably about 0.5 GPa or greater.

Typically, the two nitride liners (60, 61) are formed sequentially. For example, one of the two nitride liners (60 or 61) is deposited first by chemical vapor deposition (CVD) such as plasma enhanced chemical vapor deposition (PECVD) or low pressure chemical vapor deposition (LPCVD), and lithographically patterned and etched so that a first type of MOSFET (100 or 200) directly contacts the remaining portions of the one of the two nitride liners (60 or 61). The other liner (61 or 60) is thereafter deposited on the second type of MOSFET (200 or 100) and the remaining portions of the one of the two nitride liners (60 or 61), and lithographically patterned and etched so that a second type of MOSFET (100 or 200) directly contacts the remaining portions of the other nitride liner (61 or 60). The first type of MOSFET and the second type of MOSFET are opposite types of MOSFETs, i.e., one is a p-type MOSFET 100 and the other is an n-type MOSFET 200. The thickness of each of the two nitride liners (60, 61) is in the range from about 10 nm to about 100 nm, and preferably in the range from about 30 nm to about 70 nm.

A middle-of-line (MOL) dielectric 70 is thereafter deposited on the first and second nitride liners (60, 61). The MOL dielectric 70 typically comprises silicon oxide, such as undoped silicate glass (USG), fluorosilicate glass (FSG), or a borophosphosilicate glass (BPSG). Due to the underlying topography caused by protruding structures such as the gate spacer 40 and the low-k dielectric gate filler 52, the MOL dielectric 70 has topographical height variations as deposited. Consequently, the MOL dielectric 70 is typically planarized, for example, by chemical mechanical planarization (CMP).

Figure 10A:
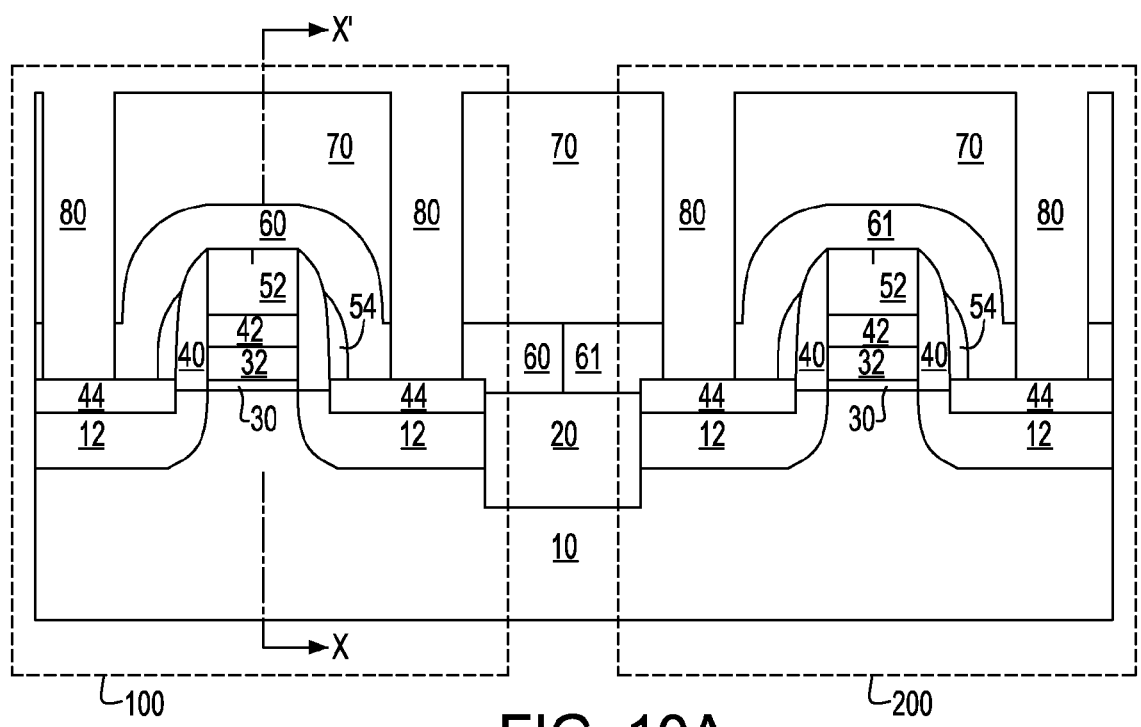
Figure 10B:
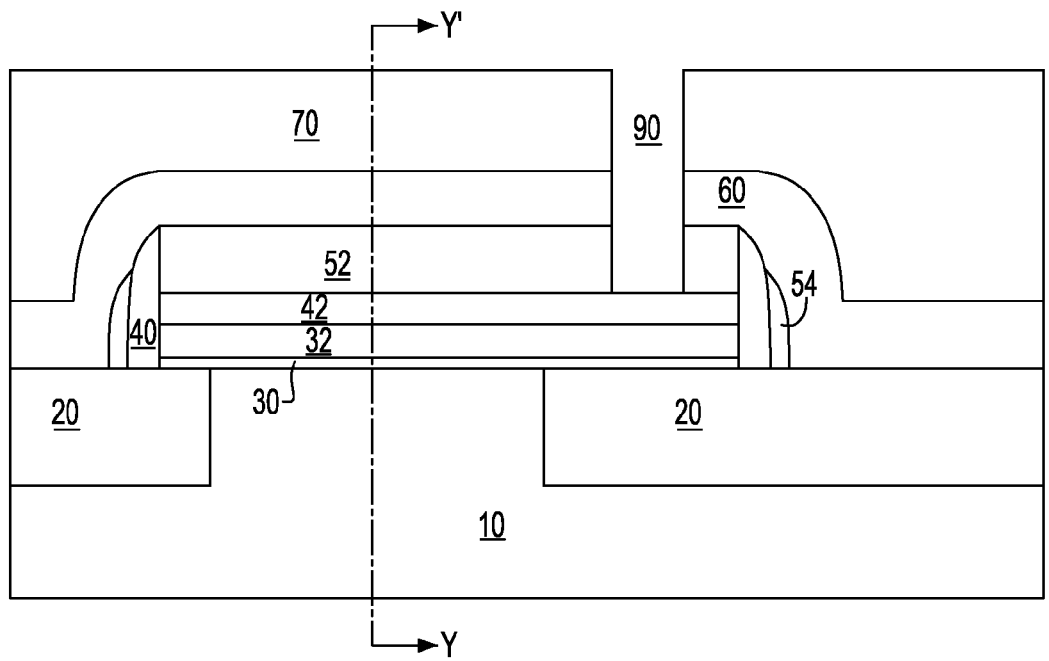
FIG. 10B shows a vertical cross-sectional view of the exemplary semiconductor structure according to the present invention along the gate line of a p-type MOSFET at the same stage of the manufacturing sequence as FIG. 10A. The plane Y-Y' is the plane of the vertical cross-section for FIG. 10A.

Referring to FIGS. 10A and 10B, contact via holes (80, 90) are formed within the MOL dielectric 90 by lithographical methods and a reactive ion etch (RIE). The contact via holes (80, 90) comprise substrate contact via holes 80 and gate contact via holes 90. The substrate contact via holes 80 are etched through the MOL dielectric 90 and one of the two nitride liners (60 or 61) down to the source and drain silicide 44. The gate contact via holes 90 are etched through the MOL dielectric 90, one of the two nitride liners (60 or 61), and the low-k dielectric gate filler 52 down to the gate silicide 42. The gate contact via holes 90 may be located above shallow trench isolation as shown in FIG. 10B, or may be located outside the shallow trench isolation 20 in an active semiconductor area. While the exemplary semiconductor structure in FIG. 10B shows a gate dielectric 30 formed by deposition, such as a high-k gate dielectric, corresponding structures with a gate dielectric formed by a thermal conversion of semiconductor material, such as thermal silicon dioxide, may be constructed by one of ordinary skill in the art.

Figure 11A:
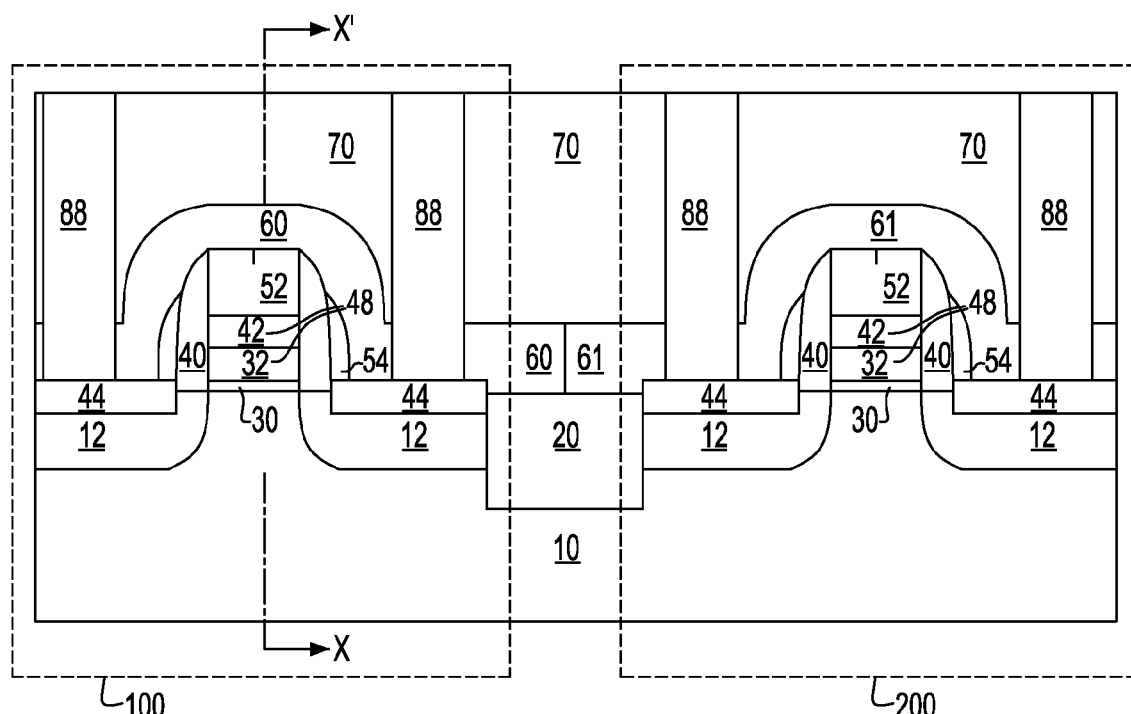
FIGS. 11A-14B show vertical cross-sectional views of the exemplary semiconductor structure according to various embodiments of the present invention. Figures labeled with the same figure numeral correspond to the same embodiment. Figure numerals 11, 12, 13, and 14 correspond to a first, a second, a third, and a fourth embodiment, respectively. Figures labeled with the suffix, "A" are vertical cross-sectional views along the plane Y-Y' in the figure with the same figure numeral and the suffix, "B," i.e., in the direction perpendicular to two gate lines. Figures labeled with the suffix, "B" are vertical cross-sectional views along the plane X-X' in the figure with the same figure numeral and the suffix, "A," i.e., along the gate line of the p-type MOSFET.
Figure 11B:
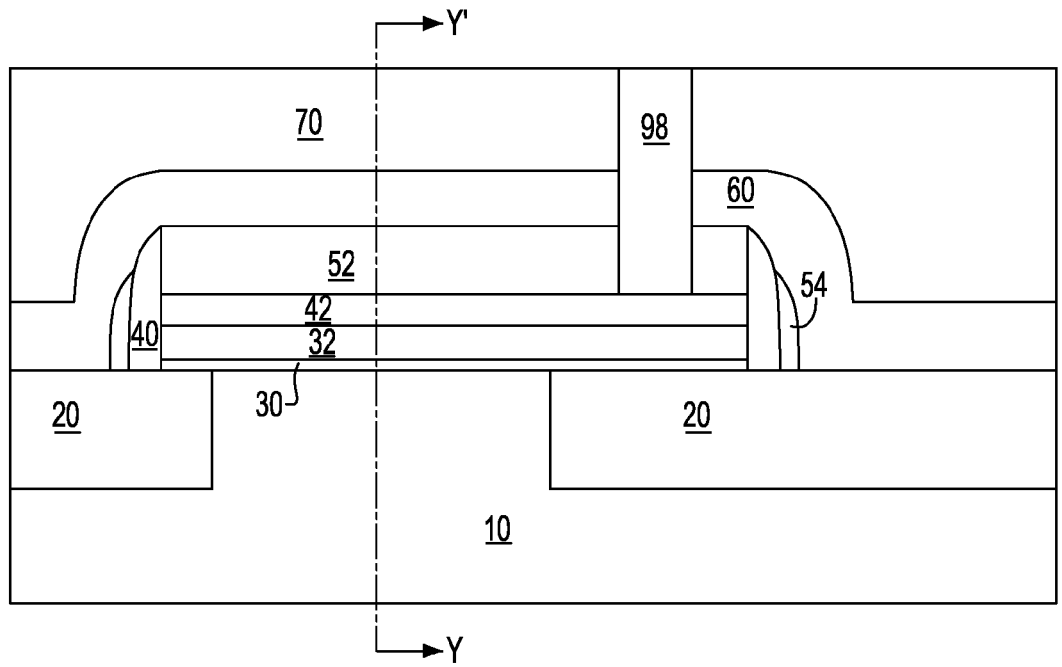

Referring to FIGS. 11A and 11B, the exemplary semiconductor structure according to the first embodiment of the present invention is shown. The contact via holes (80, 90) are filled with metal to form contact vias (88, 98). The contact vias (88, 98) comprise substrate contact vias 88 and gate contact vias 98. The contact vias (88, 98) may be formed, for example, by chemical vapor deposition (CVD) of a metal film with reactant gases containing a metallic precursor gas such as tungsten hexafluoride ($WF_6$). The portion of the metal film deposited above the MOL dielectric 70 may be removed by a blanket etch, chemical mechanical planarization (CMP), or a combination of both.

According to the first embodiment of the present invention, the low-k dielectric gate filler 52 directly contacts the inner sidewalls of the gate spacer 40 and the top surface of the gate silicide 42. The low-k dielectric gate filler 52 comprises a dielectric material with a dielectric constant of about 3.0 or less. The low-k secondary gate spacer 54 is located directly on the gate spacer 40 and the source and drain silicide 44. The low-k secondary gate spacer is disjoined from, i.e., does not abut, the source and drain regions 12. The low-k secondary gate spacer 54 comprises a dielectric material with a dielectric constant of about 3.0 or less. The top of the low-k dielectric gate filler 52 is flush with the top of the gate spacer 40.

Preferably, the first nitride liner 60 applies a compressive uniaxial stress to the channel underneath, which is located directly beneath the gate dielectric 30 and beneath the gate electrode 48 of the p-type MOSFET 100. Typically, the stress applied by the first stress liner 60 to the channel of the p-type MOSFET 100 is greater than about 0.2 GPa, and preferably greater than about 0.5 GPa. The second nitride liner 61 applies a tensile uniaxial stress to the channel underneath, which is located directly beneath the gate dielectric 30 and beneath the gate electrode 48 of the n-type MOSFET 200. Typically, the stress applied by the second stress liner 61 to the channel of the n-type MOSFET 200 is greater than about 0.2 GPa, and preferably greater than about 0.5 GPa.

Since the first gate nitride 60 and the second gate nitride 61 contact only the outer sidewalls of the gate spacer 40 and do not contact the inner sidewalls of the gate spacer 40, no stress is applied by the first or second gate nitride (60 or 61) onto the inner sidewalls of the gate spacer 40 from inside the gate spacer 40. According to the first embodiment of the present invention, therefore, there is no cancellation of stress around an upper portion of the gate spacer 40, as is the case with the prior art structure discussed above. Further, the low-k dielectric gate filler 52 and the low-k secondary gate spacer 54 reduce parasitic capacitance between the gate electrode 48 and the substrate contact vias 88.

Figure 12A:
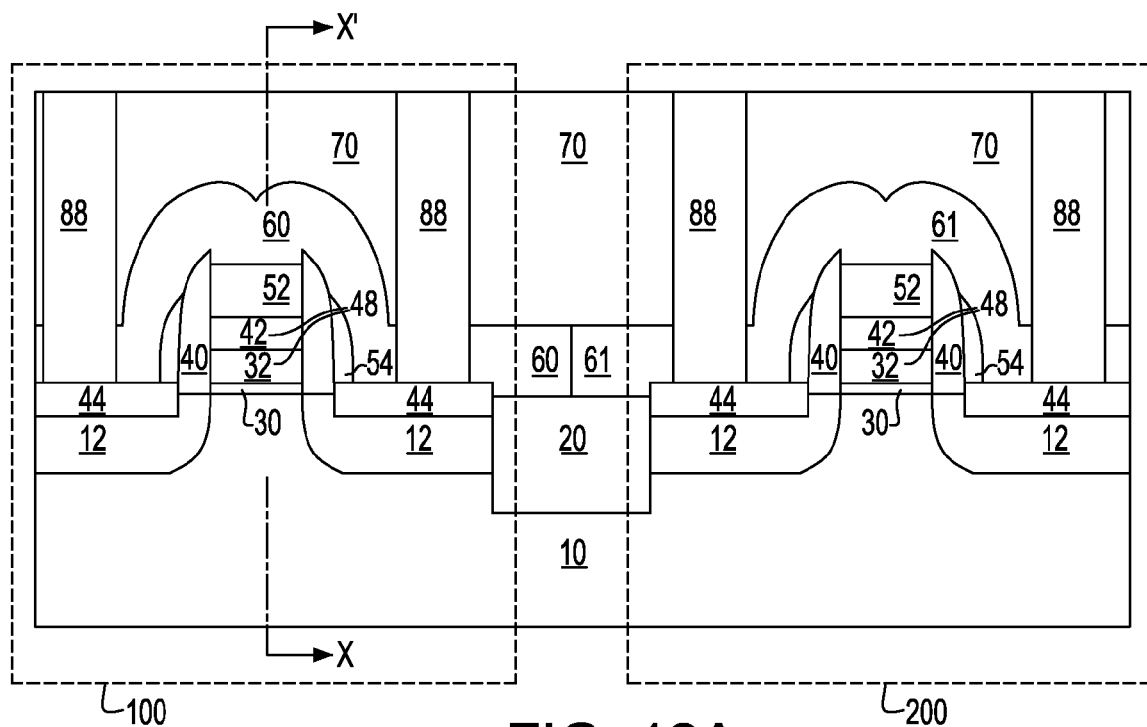
Figure 12B:
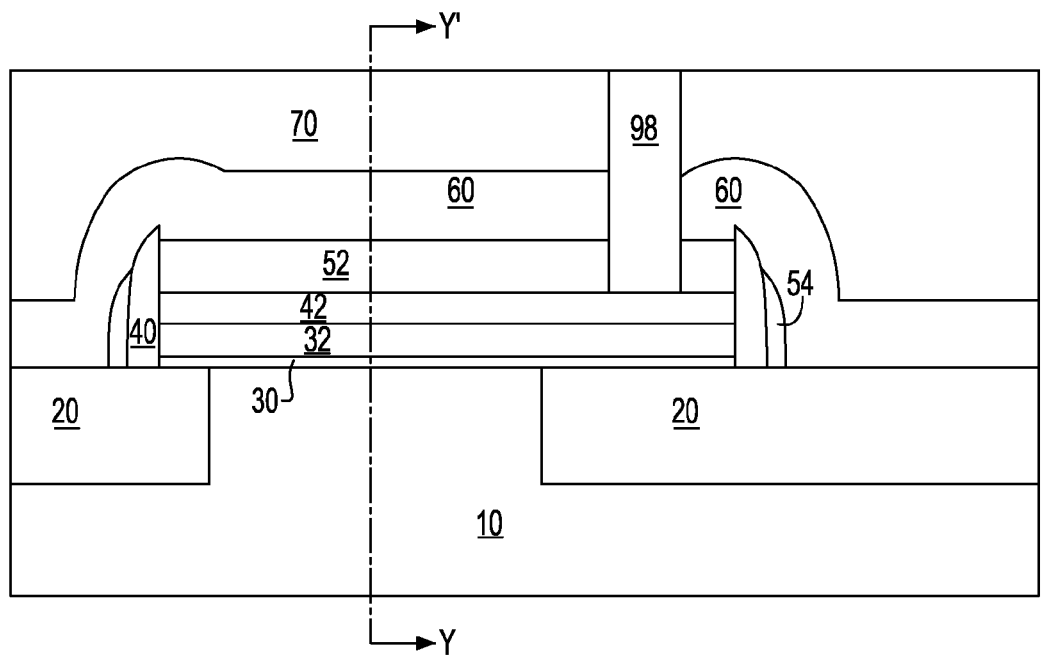

Referring to FIGS. 12A and 12B, the exemplary semiconductor structure according to the second embodiment of the present invention is shown. According to the second embodiment, the low-k dielectric filler layer 50 is recessed below the height of the top of the gate spacer 40 during the reactive ion etch (RIE) processing step described in FIG. 8 and the accompanying paragraphs. Typically, this structure according to the second embodiment is formed if the step coverage of the low-k dielectric filler layer 50 is relatively high, i.e., the ratio of the thickness of the low-k dielectric filler layer 50 on a vertical sidewall to that on a horizontal surface is relatively high, and the duration of an overetch, i.e., the continued portion of the RIE after the source and drain silicides 44 are exposed, is relatively long compared to the processing steps that produce the structure shown in FIG. 8, which corresponds to the first embodiment. After the RIE, therefore, the top surface of the low-k dielectric gate filler 52 is below the height of the top of the gate spacer 40. The portion of the inner sidewalls of the gate spacer 40 above the low-k dielectric gate filler 52 is exposed after the RIE.

The structure according to the second embodiment of the present invention after the formation of the contact vias (88, 98) therefore shares the same characteristics as those according to the first embodiment as described in the paragraphs accompanying FIGS. 11A and 11B, with one notable difference, according to which the top of the low-k dielectric gate filler 52 is not flush with, but instead recessed below, the top of the gate spacer 40, and therefore, one of the two nitride liners (60, 60') directly contacts a small portion of the inner sidewalls of the gate spacer 40 in each of the two MOSFETs (100, 200). Since the first gate nitride 60 and the second gate nitride 61 contact only a small portion of the inner sidewalls of the gate spacer 40, the effect of stress cancellation around an upper portion of the gate spacer 40 is less than the effect of stress cancellation according to the prior art. Further, the low-k dielectric gate filler 52 and the low-k secondary gate spacer 54 reduce parasitic capacitance between the gate electrode 48 and the substrate contact vias 88.

Figure 13A:
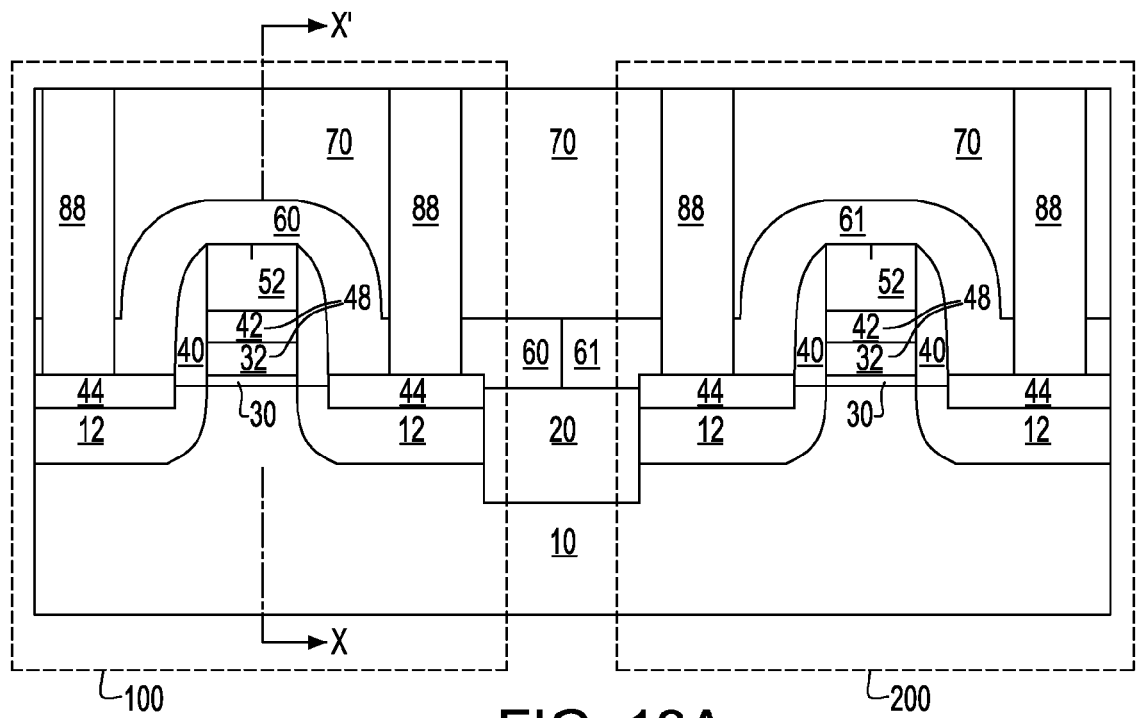
Figure 13B:
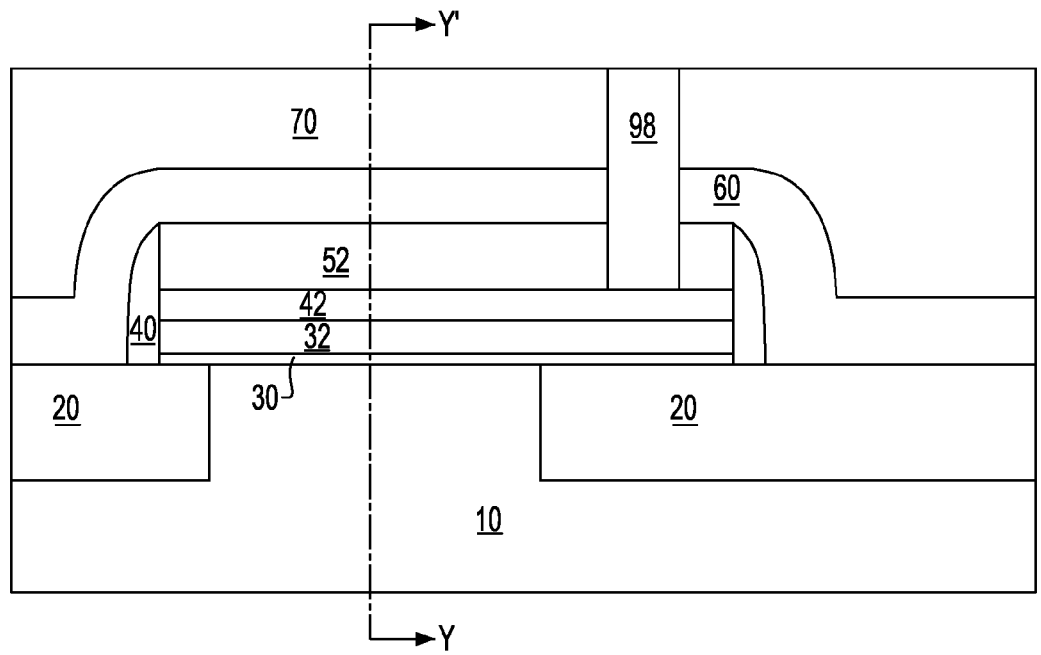

Referring to FIGS. 13A and 13B, the exemplary semiconductor structure according to the third embodiment of the present invention is shown. According to the third embodiment, the low-k secondary gate spacer 54 is not formed during the reactive ion etch (RIE) processing step described in FIG. 8 and the accompanying paragraphs. Typically, this structure according to the third embodiment is formed if the step coverage of the low-k dielectric filler layer 50 is relatively low compared to the processing steps that produce the structure shown in FIG. 8, which corresponds to the first embodiment. If the step coverage of the low-k dielectric filler layer 50 is relatively low, the low-k dielectric filler layer 50 is completely etched from above the outer sidewalls of the gate spacer 40 during the RIE, leaving no low-k secondary gate spacer 54. The top surface of the low-k dielectric gate filler 52 may be flush with the top of the gate spacer 40 as shown in FIGS. 13A and 13B, or may be recessed below the height of the top of the gate spacer 40 as in the second embodiment of the present invention. In either case, no low-k secondary gate spacer 54 is present in the exemplary semiconductor structure according to the third embodiment of the present invention.

The structure according to the third embodiment of the present invention after the formation of the contact vias (88, 98) therefore shares the same characteristics as those according to the first embodiment or the second embodiment, with one notable difference, according to which the low-k secondary gate spacer 54 is not present.

Figure 14A:
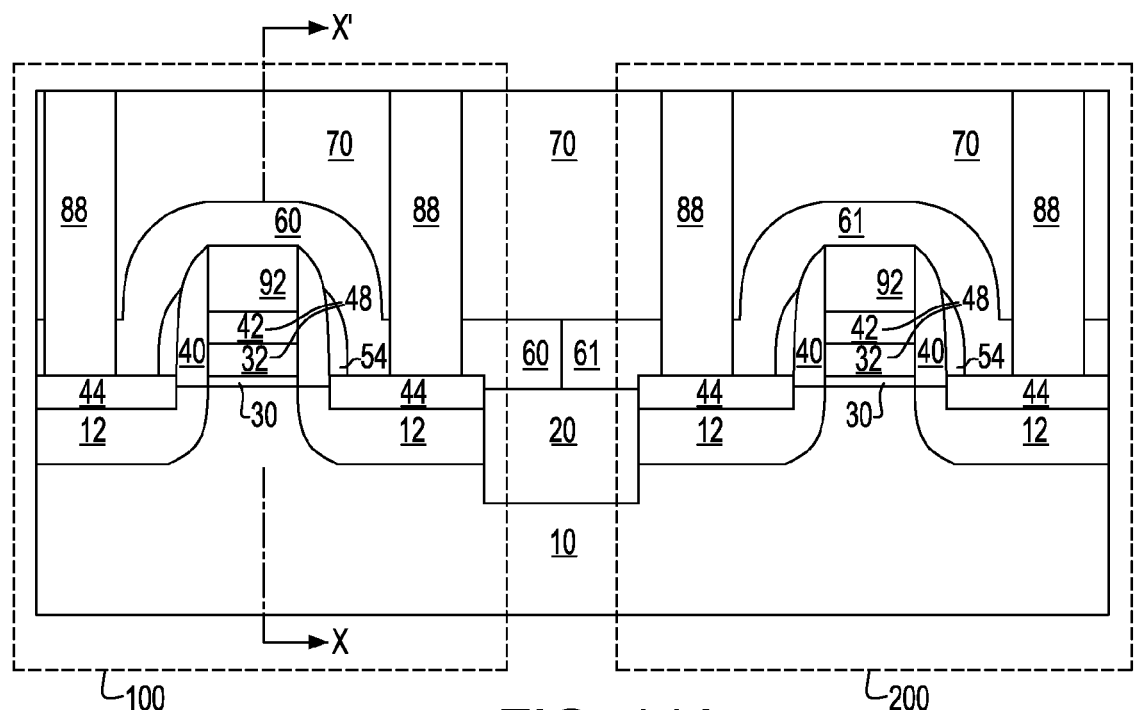
Figure 14B:
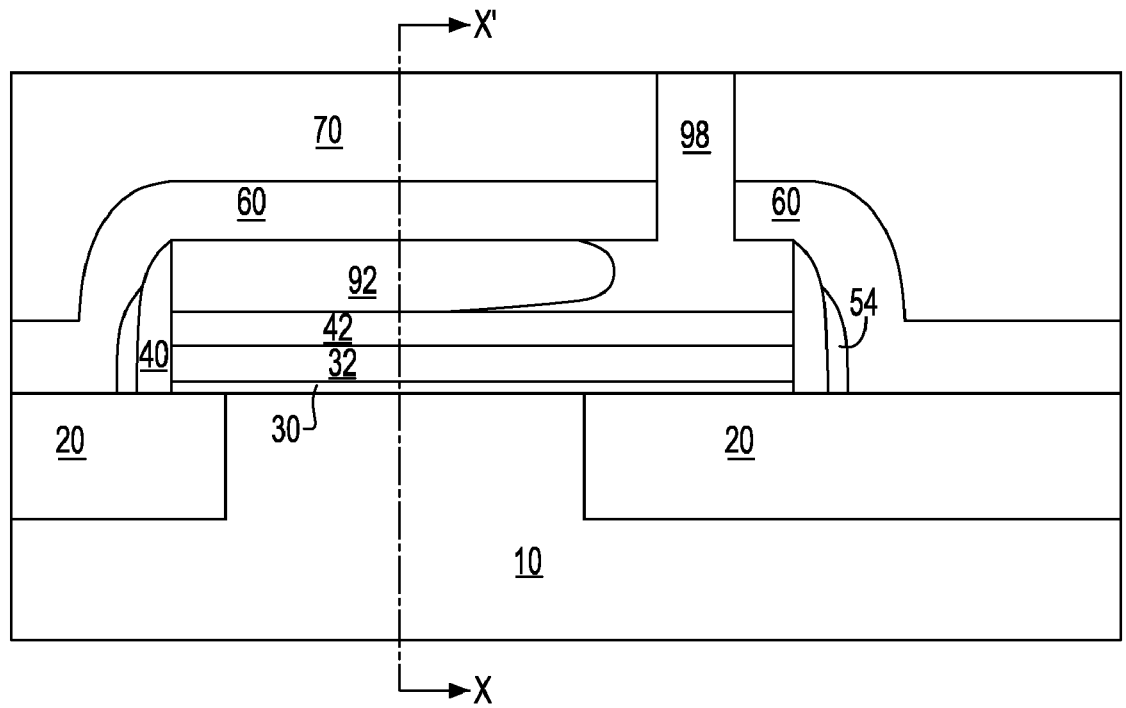

Referring to FIGS. 14A and 14B, the exemplary semiconductor structure according to the fourth embodiment of the present invention is shown. According to the fourth embodiment, the low-k dielectric gate filler 52 is etched by an lateral etch after the formation of the contact via holes (80, 90) and prior to the formation of the contact vias (88, 98). The lateral etch forms a void, or a cavity 92 in the volume that is occupied by the low-k dielectric gate filler 52 prior to the lateral etch. The low-k secondary gate spacer 54 may be present as shown in FIGS. 14A and 14B, or may be absent as in the third embodiment of the present invention. Prior to the lateral etch, the top of the low-k dielectric gate filler 52 may be flush with the top of the gate spacer 40 as implied in FIGS. 14A and 14B, or alternatively, may be recessed below the top of the gate spacer 40 as in the second embodiment of the present invention.

Since no low-k dielectric material is present on the sidewalls of substrate contact via holes 80, the size of the substrate contact via holes 80 does not change substantially during the lateral etch. According to the fourth embodiment of the present invention, the shape and the size of the substrate contact vias 88 are substantially the same as in the first through third embodiments. Since a cavity 92 is formed around the bottom of the gate contact via holes 90, each of the gate contact via 98 fills a portion of the cavity 63 outside the volume of each of the gate contact via holes 90 prior to the lateral etch. The shape of the bottom portion of each gate contact via 98 depends on the geometry of the cavity 90 and the nature of the contact via formation process, for example, the nature of the contact metal deposition. An exemplary cross-sectional view of a gate contact via 98 is shown in FIG. 14B.

According to the fourth embodiment of the present invention, the cavity 92 directly contacts the inner sidewalls of the gate spacer 40 and the top surface of the gate silicide 42. The cavity 92 also contacts a bottom surface of either the first nitride liner 60 or the second nitride liner 61. At least one gate contact via 98 contacts the gate silicide 42 and plugs the corresponding at least one gate contact via hole 90. Therefore, the cavity 92 is enclosed by the inner sidewalls of the gate spacer 40, the top surface of the gate silicide 42, the bottom surface of either the first nitride liner 60 or the second nitride liner 61, and the at least one gate contact via 98. The top of the cavity 92 may be flush with the top of the gate spacer 40 or may be recessed relative to the top of the gate conductor 40.

The low-k secondary gate spacer 54 may be, or may not be, located directly on the gate spacer 40 and the source and drain silicide 44. The low-k secondary gate spacer 54 comprises a dielectric material with a dielectric constant of about 3.0 or less. Preferably, the first nitride liner 60 applies a compressive uniaxial stress to the channel underneath, and the second nitride liner 61 applies a tensile uniaxial stress to the channel underneath. The properties of the first and second nitride liners (60, 61) may be the same as in the first embodiment of the present invention as described above.

Figure 15:
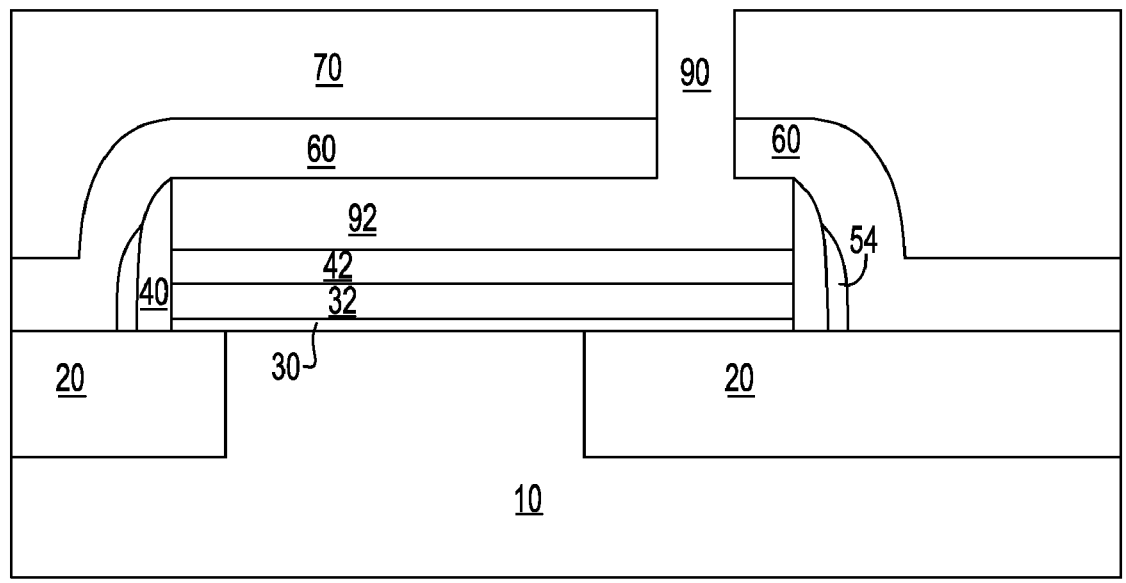
FIGS. 15-17 are sequential vertical cross-sectional views of the exemplary semiconductor structures according to the fourth embodiment during various stages of a manufacturing sequence.
Figure 16:
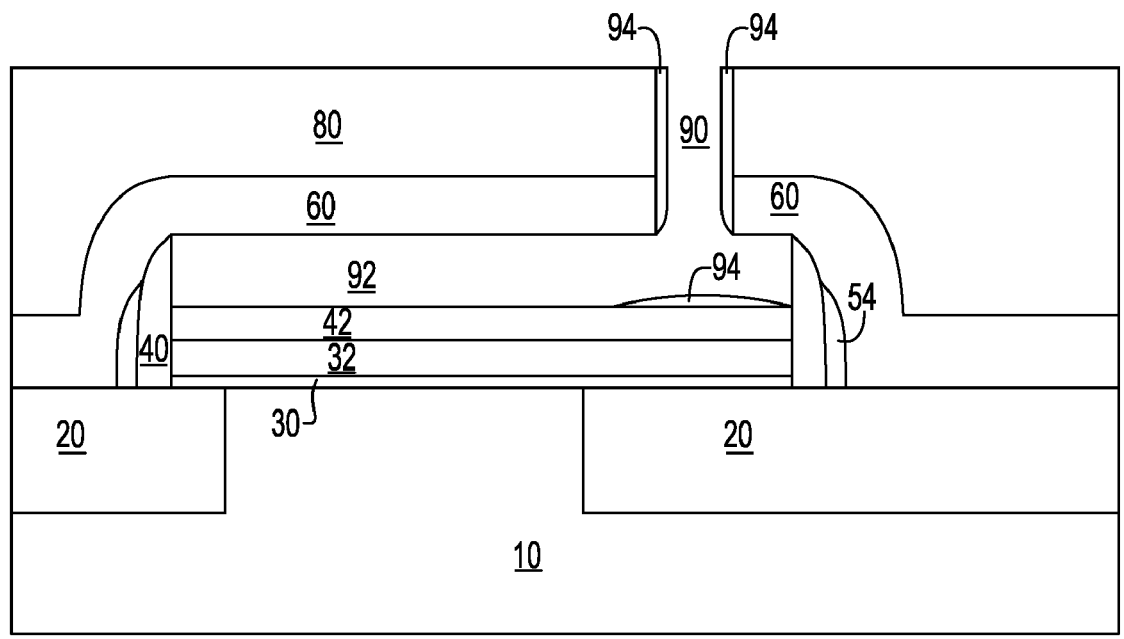
Figure 17:
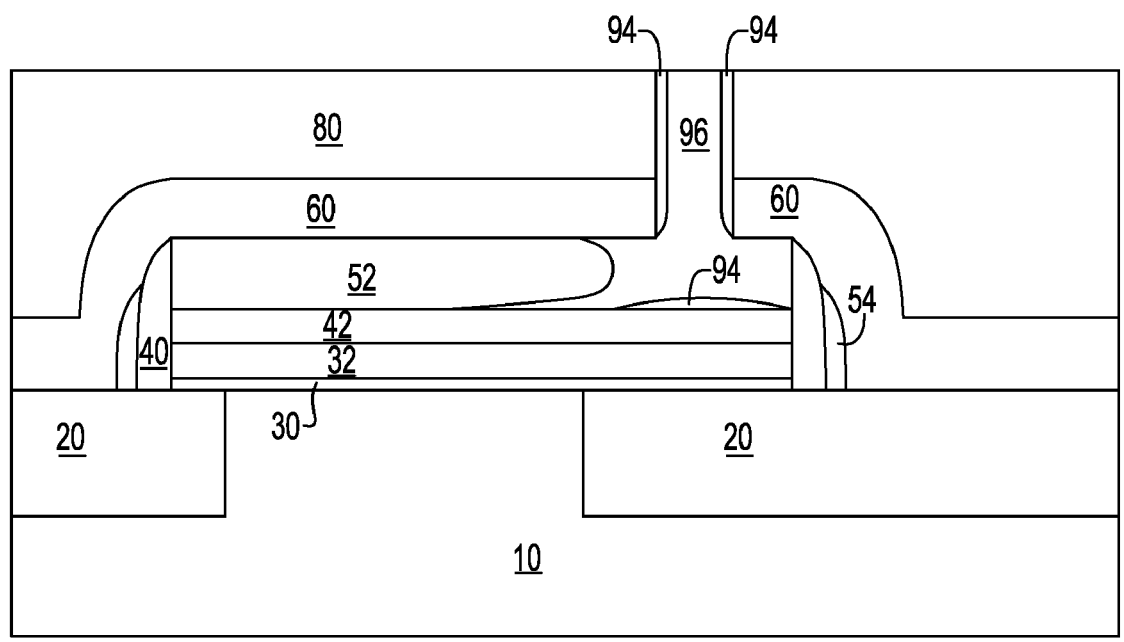

FIGS. 15-17 show intermediate stages of the exemplary semiconductor structure according to the fourth embodiment of the present invention. Referring to FIG. 15, the exemplary semiconductor structure shown in FIGS. 10A and 10B are subjected to a lateral etch that etches the low-k dielectric gate filler 52 selective to the MOL dielectric 70, the first and second nitride liners (60, 61), the gate spacers 40, the source and drain silicides 44, and the gate silicides 42. The lateral etch may be a reactive ion etch, or preferably, a wet etch. Preferably, the lateral etch is an isotropic etch. Through the lateral etch, each volume of the low-k dielectric gate filler 52 with a gate contact via hole 90 therein is converted to a cavity 92 that is surrounded by the top surface of a gate silicide 42, the inner sidewalls of a gate spacer 40, and a bottom surface of either the first nitride liner 60 or the second nitride liner 61 as shown in FIG. 15.

Referring to FIG. 16, typically a metal liner 94 is deposited on the sidewalls of the contact via holes (80, 90) including the gate contact via holes 90 that are attached to a cavity 92. The metal liner 94 is typically deposited by physical vapor deposition (PVD), i.e., sputtering in an ultra-high vacuum chamber. The metal liner 94 typically comprises a transition metal nitride or a refractory metal nitride, such as TaN, TiN, or WN. The metal liner 94 has a thickness, as measured on the sidewalls near the bottom of the contact via holes (80, 90), in the range from about 2 nm to about 10 nm, and more typically, in the range from about 3 nm to about 6 nm. The metal liner 94 promotes adhesion of the contact via to be subsequently formed to the surrounding dielectric material as well as providing a diffusion barrier layer for metallic impurities. In the case of the substrate contact via holes 80, a continuous metal liner 94 is formed on the inner sidewalls and the bottom of the substrate contact via holes 80. In the case of gate contact via holes 90, the metal liner 94 may be discontinuous, as shown in FIG. 16, or continuous depending on the geometry of the cavity 92.

Referring to FIG. 17, contact vias 98 are formed typically by depositing a metal fill 96 into the contact via holes (80, 90) on the surface of the metal liner 94 to fill the contact via holes (80, 90) completely and by removing the excess metal (not shown) either by an etch, chemical mechanical planarization (CMP), or a combination of both. The metal fill 96 may be formed, for example, by chemical vapor deposition (CVD) of a metal film with reactant gases containing a metallic precursor gas such as tungsten hexafluoride ($WF_6$). The metal liner 94 and the metal fill 98 collectively form the contact vias (88, 98). FIG. 17 and FIG. 14B are the same figures except that the metal liner 94 and the metal fill 98 are shown separately in FIG. 17, but are shown collectively as a gate contact via 98 in FIG. 14B.

Figure 18:
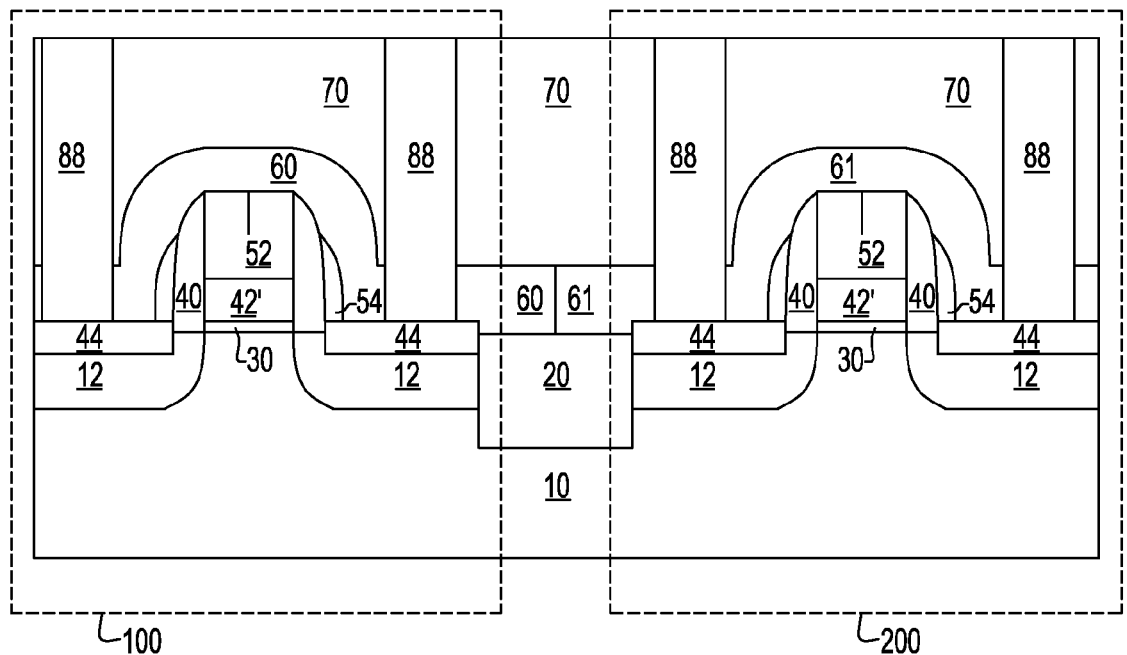
FIG. 18 is a vertical cross-section of another exemplary semiconductor structure containing a fully silicided gate electrode and a low-k dielectric gate filler.

Referring to FIG. 18, another exemplary semiconductor structure according to the present invention comprises a fully silicided gate electrodes 42' and a low-k-dielectric gate filler 52 in each of the MOSFETs (100, 200). The fully silicided gate electrode 42' comprises a metal silicide, and directly contacts the gate dielectric 30. Preferably, the gate dielectric 30 comprises a high-k dielectric material in this exemplary semiconductor structure. The fully silicided gate electrode 42' is formed by adjusting the thickness of the silicon containing gate conductor 32 so that all of the material in the silicon containing gate conductor 32 is consumed during a silicidation process to form a fully silicided gate electrode 42'. The low-k-dielectric gate filer 52 directly contacts the fully silicided gate electrode 42'.

Figure 19:
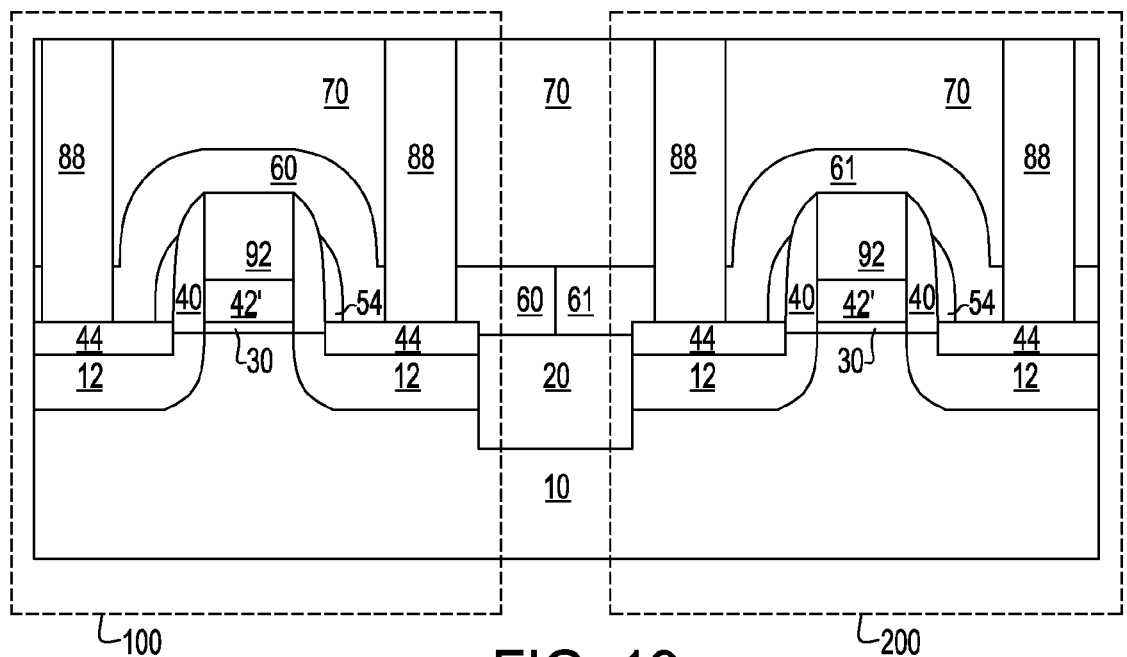
FIG. 19 is a vertical cross-section of yet another exemplary semiconductor structure containing a fully silicided gate electrode and an enclosed cavity.

Referring to FIG. 19, yet another exemplary semiconductor structure according to the present invention comprises a fully silicided gate electrode 42' and an enclosed cavity 92 in each of the MOSFETs (100, 200). The fully silicided gate electrode 42' comprises a metal silicide, and directly contacts the gate dielectric 30. Preferably, the gate dielectric 30 comprises a high-k dielectric material in this exemplary semiconductor structure. The fully silicided gate electrode 42' is formed by the methods describes above. The enclosed cavity is located directly on the fully silicided gate electrodes 42'.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A metal-oxide-semiconductor field effect transistor (MOSFET) structure comprising:
 a gate electrode contacting a gate dielectric, wherein said gate dielectric comprises a high-k dielectric material and said gate electrode is a fully silicided gate electrode comprising a metal silicide, wherein said metal silicide directly contacts said gate dielectric;

a gate spacer having inner sidewalls contacting said gate electrode;

an enclosed cavity having a dielectric constant of about 1.0 and contacting said gate electrode and said inner sidewalls of said gate spacer; and at least one contact via directly contacting said enclosed cavity and said gate silicide.

2. The MOSFET structure of claim 1, further comprising a low-k secondary gate spacer having a dielectric constant of about 3.0 or less and contacting said gate spacer and a source and drain silicide, and disjoined from a source and drain region.

3. The MOSFET structure of claim 1, further comprising a nitride liner contacting said enclosed cavity and said gate spacer.

4. The MOSFET structure of claim 3, wherein said nitride liner applies a stress greater than about 0.2 GPa to a channel located directly beneath said gate dielectric.

* * * * *